US009646809B2

(12) United States Patent
Gremion et al.

(10) Patent No.: US 9,646,809 B2
(45) Date of Patent: May 9, 2017

(54) INTAGLIO PRINTING PLATE COATING APPARATUS

(71) Applicant: KBA-NOTASYS SA, Lausanne (CH)

(72) Inventors: François Gremion, Plan-les-Ouates (CH); Laurent Claude, St-Sulpice (CH)

(73) Assignee: KBA-NotaSys SA, Lausanne (CH)

( * ) Notice: Subject to any disclaimer, the term of this patent is extended or adjusted under 35 U.S.C. 154(b) by 101 days.

(21) Appl. No.: 14/391,117

(22) PCT Filed: Apr. 12, 2013

(86) PCT No.: PCT/IB2013/052923
§ 371 (c)(1),
(2) Date: Oct. 7, 2014

(87) PCT Pub. No.: WO2013/153536
PCT Pub. Date: Oct. 17, 2013

(65) Prior Publication Data
US 2015/0075979 A1 Mar. 19, 2015

(30) Foreign Application Priority Data

Apr. 12, 2012 (EP) .................................... 12163838

(51) Int. Cl.
C23C 14/35 (2006.01)
H01J 37/34 (2006.01)
(Continued)

(52) U.S. Cl.
CPC .......... H01J 37/3426 (2013.01); B41N 3/003 (2013.01); C23C 14/14 (2013.01);
(Continued)

(58) Field of Classification Search
CPC ....... B41N 3/003; C23C 14/14; C23C 14/165; C23C 14/3464; C23C 14/35; C23C 14/46;
(Continued)

(56) References Cited

U.S. PATENT DOCUMENTS 4,221,652 A 9/1980 Kuriyama
4,274,936 A * 6/1981 Love ..................... C23C 14/568
118/719

(Continued)

FOREIGN PATENT DOCUMENTS

JP 06-200372 * 7/1994
WO WO 03/103962 12/2003
(Continued)

OTHER PUBLICATIONS

Machine Translation 06-200372 dated Jul. 1994.*
(Continued)

Primary Examiner — Rodney McDonald
(74) Attorney, Agent, or Firm — Nixon & Vanderhye P.C.

(57) ABSTRACT

There is described an intaglio printing plate coating apparatus (1) comprising a vacuum chamber (3) having an inner space (30) adapted to receive at least one intaglio printing plate (10) to be coated, a vacuum system (4) coupled to the vacuum chamber (3) adapted to create vacuum in the inner space (30) of the vacuum chamber (3), and a physical vapour deposition (PVD) system (5) adapted to perform deposition of wear-resistant coating material under vacuum onto an engraved surface (10a) of the intaglio printing plate (10), which physical vapour deposition system (5) includes at least one coating material target (51, 52) comprising a source of the wear-resistant coating material to be deposited onto the engraved surface (10a) of the intaglio printing plate (10). The vacuum chamber (3) is arranged so that the intaglio printing plate (10) to be coated sits substantially (Continued)

vertically in the inner space (30) of the vacuum chamber (3) with its engraved surface (10*a*) facing the at least one coating material target (51, 52). The intaglio printing plate coating apparatus (1) further comprises a movable carrier (6) located within the inner space (30) of the vacuum chamber (3) and adapted to support and cyclically move the intaglio printing plate (10) in front of and past the at least one coating material target (51, 52).

20 Claims, 10 Drawing Sheets

(51) Int. Cl.
*B41N 3/00* (2006.01)
*C23C 14/50* (2006.01)
*C23C 14/16* (2006.01)
*C23C 14/14* (2006.01)
*C23C 14/34* (2006.01)
*C23C 14/46* (2006.01)

(52) U.S. Cl.
CPC ........ *C23C 14/165* (2013.01); *C23C 14/3464* (2013.01); *C23C 14/35* (2013.01); *C23C 14/46* (2013.01); *C23C 14/50* (2013.01); *H01J 37/3405* (2013.01); *H01J 37/3435* (2013.01); *H01J 37/3447* (2013.01); *H01J 37/3461* (2013.01); *H01J 2237/332* (2013.01)

(58) Field of Classification Search
CPC ... C23C 14/50; H01J 37/3405; H01J 37/3426; H01J 37/3435; H01J 37/3447; H01J 37/3461; H01J 2237/332
USPC ............ 204/192.16, 298.11, 298.07, 298.23, 204/298.25, 298.26, 298.29
See application file for complete search history.

(56) References Cited

U.S. PATENT DOCUMENTS

| | | | | |
|---|---|---|---|---|
| 4,851,095 A | * | 7/1989 | Scobey | ..................... C23C 8/02 204/192.12 |
| 4,892,451 A | | 1/1990 | Mahler | |
| 5,135,629 A | * | 8/1992 | Sawada | ................. C23C 14/564 118/715 |
| 5,252,360 A | | 10/1993 | Huttl et al. | |
| 5,538,610 A | * | 7/1996 | Gesche | ................. C23C 14/022 204/298.15 |
| 5,744,011 A | * | 4/1998 | Okubo | .................. C23C 14/086 204/192.12 |
| 6,171,454 B1 | * | 1/2001 | Weber | ................. C23C 14/0036 118/723 E |
| 8,906,206 B2 | * | 12/2014 | Hartig | .................. B65G 49/063 204/192.1 |
| 2002/0046945 A1 | | 4/2002 | Hosokawa | |
| 2002/0078892 A1 | | 6/2002 | Takahashi | |
| 2004/0232108 A1 | | 11/2004 | Giori | |
| 2006/0035021 A1 | | 2/2006 | Hartig | |
| 2009/0059304 A1 | | 3/2009 | Manfredi et al. | |
| 2011/0068509 A1 | | 3/2011 | Perrier | |
| 2011/0139246 A1 | | 6/2011 | Drayton | |

FOREIGN PATENT DOCUMENTS

WO  WO2007/119203  10/2007
WO  WO2009/138901  11/2009

OTHER PUBLICATIONS

Machine Translation DE 019516883A1 dated Nov. 1995.*
M. Viticoli et al., "Deposition of PVD coatings on electroformed nickel plates: an innovative solution for banknotes intaglio printing", AIFM ((Associazione Italiana Finiture dei Metalli / Italian Association of Metal Finishing)—Galvanotecnica (http://www.galvanotecnica.org), Mar. 2011 [Viticoli2011].
International Search Report for PCT/IB2013/052923 mailed Aug. 4, 2014.
Written Opinion of the International Searching Authority for PCT/IB2013/052923 mailed Aug. 4, 2014.

* cited by examiner

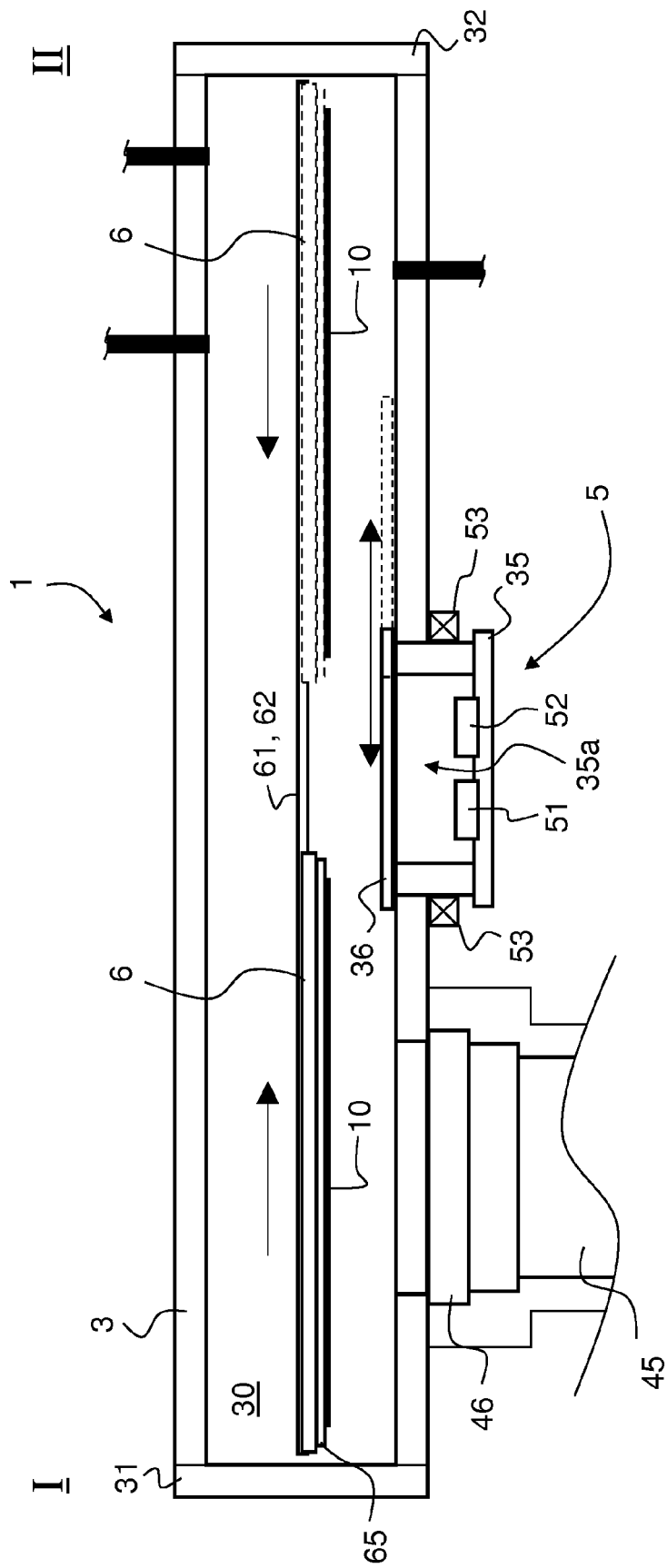

INTAGLIO PRINTING PLATE COATING APPARATUS

This application is the U.S. national phase of International Application No. PCT/IB2013/052923 filed 12 Apr. 2013 which designated the U.S. and claims priority to EP 12163838.1 filed 12 Apr. 2012, the entire contents of each of which are hereby incorporated by reference.

TECHNICAL FIELD

The present invention generally relates to an intaglio printing plate coating apparatus for the coating of intaglio printing plates as used for the production of security documents. More precisely, the present invention relates to such an intaglio printing plate coating apparatus which can perform coating of intaglio printing plates by physical vapour deposition (PVD) of a wear-resistant coating material, such as but not limited to chromium.

BACKGROUND OF THE INVENTION

In the art of security printing, security documents, such as banknotes, typically involve a so-called intaglio printing operation making use of intaglio printing plates (or like printing mediums) having complex curvilinear patterns engraved in the surface of the intaglio printing plates (see e.g. International Publications Nos. WO 03/103962 A1, WO 2007/119203 A1 and WO 2009/138901 A1 which are all incorporated herein by reference).

Nowadays, intaglio printing plates for the production of security documents are typically produced by laser engraving of a polymer precursor plate (see e.g. WO 03/103962 A1) or by direct laser engraving of a metallic plate (see e.g. WO 03/103962 A1 and WO 2009/138901 A1). Alternative solutions include the direct mechanical engraving of a metallic plate using rotating chisels or the like, or etching of a metallic plate which has first been provided with a suitable etch-resistant mask by photolithographic techniques. In all cases, prior to being used on an intaglio printing press, the intaglio printing plates are first provided with a wear-resistant coating of, usually, chromium with a view to increase the surface hardness of the intaglio printing plate, and therefore its resistance to wear, as well as the resistance to corrosion.

To date, intaglio printing plates are commonly chromed by electroplating (or "chrome plating"), i.e. by subjecting the uncoated intaglio printing plates to galvanic processing in a chromium bath. Chrome plating is however potentially problematic from a health standpoint due to the production of hexavalent chromium (or "chromium VI") compounds which require suitable treatment and careful handling.

A potential alternative to chrome plating is the deposition of chromium (or similar wear-resistant coatings) by physical vapour deposition (PVD) techniques. PVD is a process whereby atoms are ejected from a solid target material usually by ion or atom bombardment in a vacuum environment and then deposited onto a desired substrate.

Deposition of wear-resistant coating materials onto printing mediums, especially engraved printing mediums, is already known as such in the art. U.S. Pat. No. 5,252,360 (and corresponding European Patent No. EP 0 446 762 B1) for instance discloses a process for the protection of an engraved roll or plate, for example for gravure printing, wherein a base body of metal whose surface is provided with engraved cells is coated with at least one layer of a metal or metal compound in order to increase the wear resistance and the corrosion resistance of the engraved roll or plate. According to U.S. Pat. No. 5,252,360, a dense interlayer of a metal-containing component or ceramic-containing component having a thickness of about 10 to 15 microns and a Vickers hardness of at least 850 HV is first provided onto the surface of the engraved roll or plate. This interlayer is for instance applied by spraying or electrolytically. The surface of this interlayer is thereafter polished and cleaned, and then subjected to vacuum. While being kept under vacuum, the base body is heated up for tempering purposes to a temperature of at least 240° C. to about 480° C. for a time period of at least 1 hour up to abut 4 hours. Then, at the end of the tempering period, while the tempered engraved base body with its interlayer is continuously subjected to vacuum and kept in a heated up condition between 200° C. and 480° C., a wear-resistant layer of a metal compound having a Vickers hardness of at least 2000 HV is formed by physical vapour deposition in a thickness of about 4 to 8 microns, this vapour-deposited wear-resistant layer being ultimately polished.

U.S. Pat. No. 5,252,360 does not specifically disclose or refer to any particular type of coating apparatus to perform PVD deposition of the wear-resistant material. German Patent Publication No. DE 195 16 883 A1 similarly discloses an engraved printing medium for gravure printing, which engraved printing medium is provided with a thin layer of wear-resistant coating material. DE 195 16 883 A1 contains a vague reference to the use of a vacuum coating apparatus for performing the deposition of the wear-resistant coating material, but does not precisely describe the relevant vacuum coating apparatus.

PVD coating apparatuses are known in the art for applications other than for the coating of printing plates. These apparatuses are however not directly suitable for the processing of intaglio printing plates for the production of security documents. The known PVD coating apparatuses are typically either too small or too large and unable to deposit coatings of the desired properties and thicknesses as required in the context of the production of intaglio printing plates. Such is the case for instance of the PVD coating apparatus disclosed in U.S. Pat. No. 4,892,451 which specifically relates to the processing of data storage disks, such as CDs and magnetic disks, semiconductor wafers, and like substrates in plate form for optical and/or electronic purposes.

Similarly, the coating method disclosed in US Patent Publication No. US 2011/0139246 A1 is specifically applied for the deposition of a thin transparent conductive oxide (TCO) layer on a substrate for use in photovoltaic devices, which method is not directly transposable to the coating of intaglio printing plates for the production of security documents.

An improved solution is thus required.

SUMMARY OF THE INVENTION

A general aim of the invention is therefore to provide an improved coating apparatus as compared to solutions already known in the art and that is better suited to the coating of intaglio printing plates as used for security printing.

A further aim of the invention is to provide such a coating apparatus that can reliably and efficiently enable coating of intaglio printing plates with a layer of wear-resistant coating material.

Yet another aim of the invention is to provide such a coating apparatus that is easy to operate and that facilitates maintenance operations.

These aims are achieved thanks to the intaglio printing plate coating apparatus defined in the claims.

According to the invention, there is accordingly provided an intaglio printing plate coating apparatus comprising a vacuum chamber having an inner space adapted to receive at least one intaglio printing plate to be coated, a vacuum system coupled to the vacuum chamber for creating vacuum in the inner space of the vacuum chamber, and a physical vapour deposition (PVD) system for the deposition of wear-resistant coating material under vacuum onto an engraved surface of the intaglio printing plate, which physical vapour deposition system includes at least one coating material target comprising a source of the wear-resistant coating material to be deposited onto the engraved surface of the intaglio printing plate. The vacuum chamber is arranged so that the intaglio printing plate to be coated sits substantially vertically in the inner space of the vacuum chamber with its engraved surface facing the at least one coating material target. The intaglio printing plate coating apparatus further comprises a movable carrier located within the inner space of the vacuum chamber and adapted to support and cyclically move the intaglio printing plate in front of and past the at least one coating material target.

According to the invention, an intaglio printing plate can be suitably provided with a coating of wear-resistant material. The configuration of the vacuum chamber associated with the cyclical movement of the movable carrier supporting the intaglio printing plate ensures that a high-quality coating can be formed on the engraved surface of the intaglio printing plate. This arrangement further allows for a reasonably compact overall configuration of the coating apparatus. The verticality of the vacuum chamber is further advantageous in that it substantially reduces the risk of impurities and the like falling onto the engraved surface of the intaglio printing plate.

In accordance with a preferred embodiment of the invention, the physical vapour deposition system is a sputtering system comprising at least one sputtering target in the form of a magnetron acting as the coating material target, a sputtering gas supply for supplying a sputtering gas to the inner space of the vacuum chamber, and an ionization system for causing sputtering of the wear-resistant coating material of the at least one sputtering target and deposition of the sputtered wear-resistant coating material onto the engraved surface of the intaglio printing plate. In this context, the sputtering system may advantageously comprise at least two sputtering targets each comprising a source of a wear-resistant coating material to be sputtered, such as pure chromium or titanium. In the context of the present invention, sputtering has demonstrated to be a particularly suitable PVD coating technique which is well adapted to the coating of intaglio printing plates.

In an advantageous embodiment, the vacuum chamber and movable carrier are arranged so that the intaglio printing plate to be coated is inclined rearwards, an angle of inclination between the engraved surface of the intaglio printing plate and a vertical plane preferably not exceeding 20 degrees.

In accordance with a further embodiment, the movable carrier is adapted to translate the intaglio printing plate back and forth within the inner space of the vacuum chamber and along a translation path in front of the at least one coating material target. In the context of the invention, it should be appreciated that the cyclical movement of the intaglio printing plate could occur differently than by translation, for instance by rotation or oscillation about a rotation axis. The translational movement is however preferred in that it greatly simplifies the configuration of the vacuum chamber and of the overall coating apparatus.

In the context of the above embodiment, the vacuum chamber may advantageously exhibit an elongated shape with first and second extremities at both ends of the translation path of the movable carrier, a first seal door being provided at the first extremity of the vacuum chamber, which first seal door provides an access to the inner space of the vacuum chamber to allow loading of an intaglio printing plate to be coated or unloading of a coated intaglio printing plate. The first extremity of the vacuum chamber can conveniently be coupled to a cleanroom from which loading or unloading of intaglio printing plates to or from the vacuum chamber is performed. A second seal door can further be provided at the second extremity of the vacuum chamber, which second seal door provides a further access to the inner space of the vacuum chamber for maintenance purposes.

According to an advantageous embodiment, removable protective panels are provided on at least a rear inner wall of the vacuum chamber behind the movable carrier. These removable protective panels are designed to favour and facilitate maintenance operations.

In yet another embodiment, the movable carrier is adapted to receive an intaglio printing plate support onto which the intaglio printing plate is mounted, which intaglio printing plate support is removable from the movable carrier together with the intaglio printing plate.

In accordance with a preferred embodiment of the invention, the vacuum chamber comprises a frontal opening communicating with the inner space of the vacuum chamber and accommodating a retractable seal panel onto which the at least one coating material target is located, which retractable seal panel can be moved between a retracted position during maintenance operations, thereby providing access to the inner space of the vacuum chamber through the frontal opening, and a working position where the frontal opening is closed in a sealed manner by the retractable seal panel, thereby bringing the at least one coating material target to an operating position within the frontal opening.

In this particular context, the retractable seal panel can advantageously be pivoted at one end onto the vacuum chamber, the retractable seal panel preferably lying, in the retracted position, substantially horizontally with a surface of the at least one coating material target being oriented upwards.

Even more preferably, the intaglio printing plate coating apparatus further comprises a shutter mechanism for selectively creating a separation between the inner space of the vacuum chamber and the at least one coating material target located on the retractable seal panel.

In addition, and in the context of a sputtering system acting as the physical vapour deposition system which comprises at least one sputtering target in the form of a magnetron acting as the coating material target, the coating apparatus may further be provided with means for shaping a magnetic field of the magnetron. Such means may in particular include an electrical winding surrounding the frontal opening and being placed in the vicinity of the at least one coating material target, when brought to the operating position, which electrical winding is energized during a sputtering operation.

In a further embodiment, the vacuum system comprises a main pump system and at least one turbomolecular vacuum pump, which turbomolecular vacuum pump is preferably coupled to the inner space of the vacuum chamber via a control gate valve.

Further advantageous embodiments of the invention form the subject-matter of the dependent claims and are discussed below.

BRIEF DESCRIPTION OF THE DRAWINGS

Other features and advantages of the present invention will appear more clearly from reading the following detailed description of embodiments of the invention which are presented solely by way of non-restrictive examples and illustrated by the attached drawings in which:

FIG. 6 is a schematic diagram of the vacuum chamber of the intaglio printing plate coating apparatus and illustrating a translational movement of a movable carrier supporting the intaglio printing plate to be coated ;

DETAILED DESCRIPTION OF EMBODIMENTS OF THE INVENTION

Within the context of the present invention, the expression "intaglio printing plate" specifically designates an engraved printing plate as used for the production of security documents, such as banknotes. Such "intaglio printing plates" are to be distinguished from gravure printing mediums which are used in gravure printing for the production of magazines or packagings. In gravure printing, a so-called gravure cylinder is typically used as the printing medium, which gravure cylinder is commonly provided with a plurality of ink-retaining cells of varying sizes and/or depths, which cells are distributed according to a uniform and regular pattern onto the circumference of the gravure cylinder. In contrast, intaglio printing plates as used in the art of security printing are provided with complex and intricate curvilinear patterns which are engraved in the surface of the printing plate (see again International Publications Nos. WO 03/103962 A1, WO 2007/119203 A1 and WO 2009/138901 A1 which relate to the production of intaglio printing plates for security printing applications).

Figure 1:
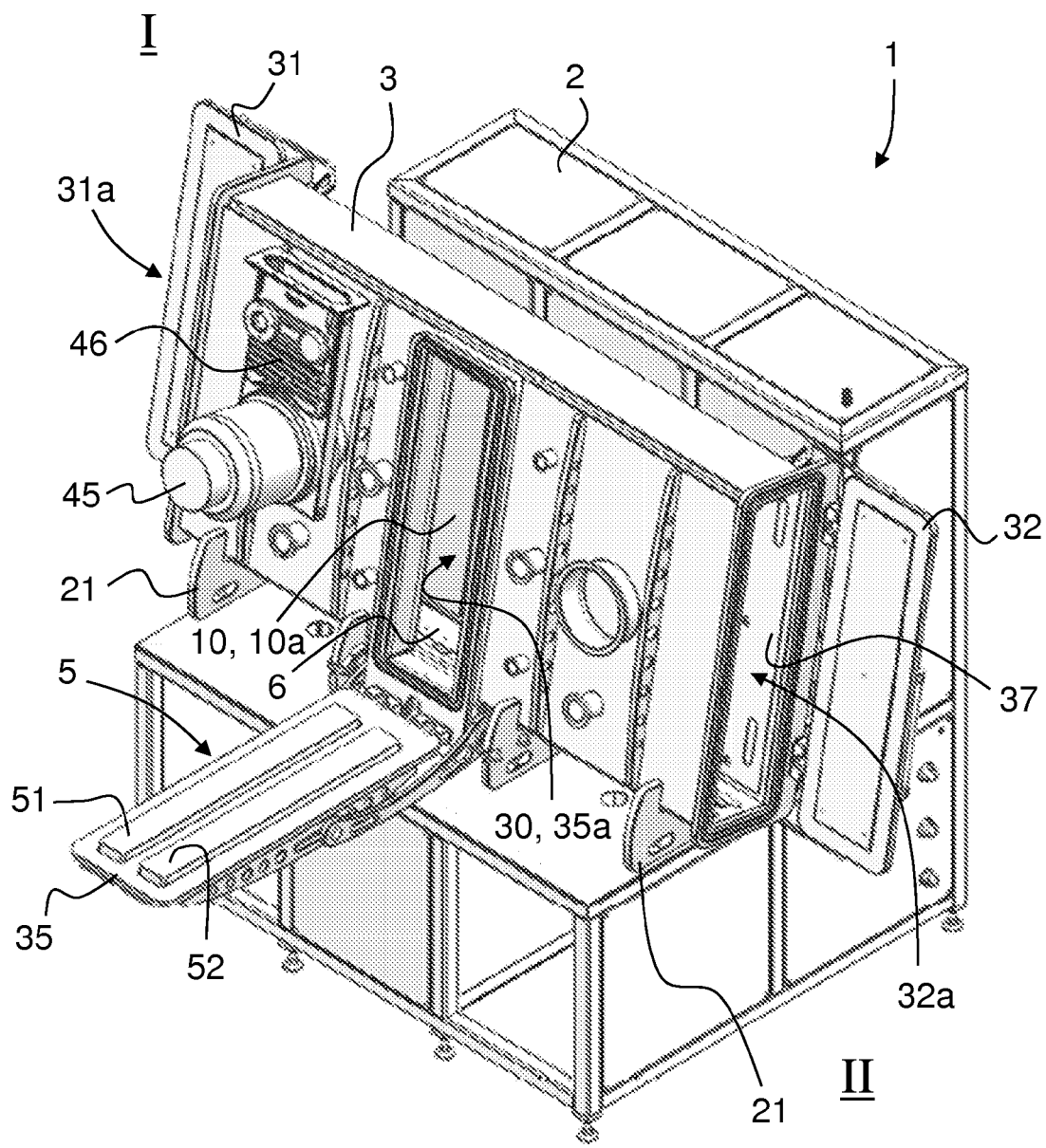
FIG. 1 is a perspective view of an intaglio printing plate coating apparatus according to a preferred embodiment of the invention.
Figure 2:
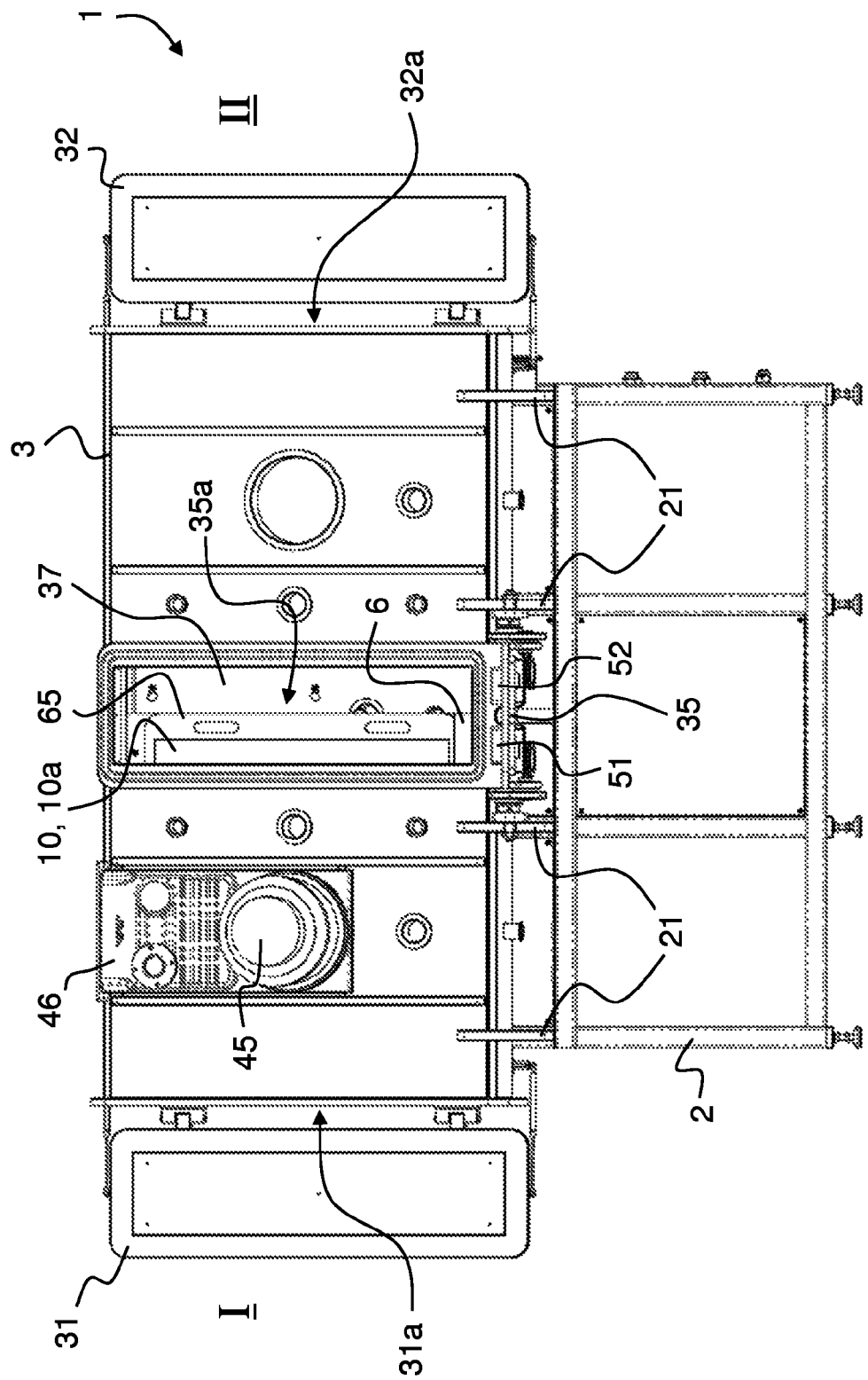
FIG. 2 is a front view of the intaglio printing plate coating apparatus of FIG. 1.
Figure 3:
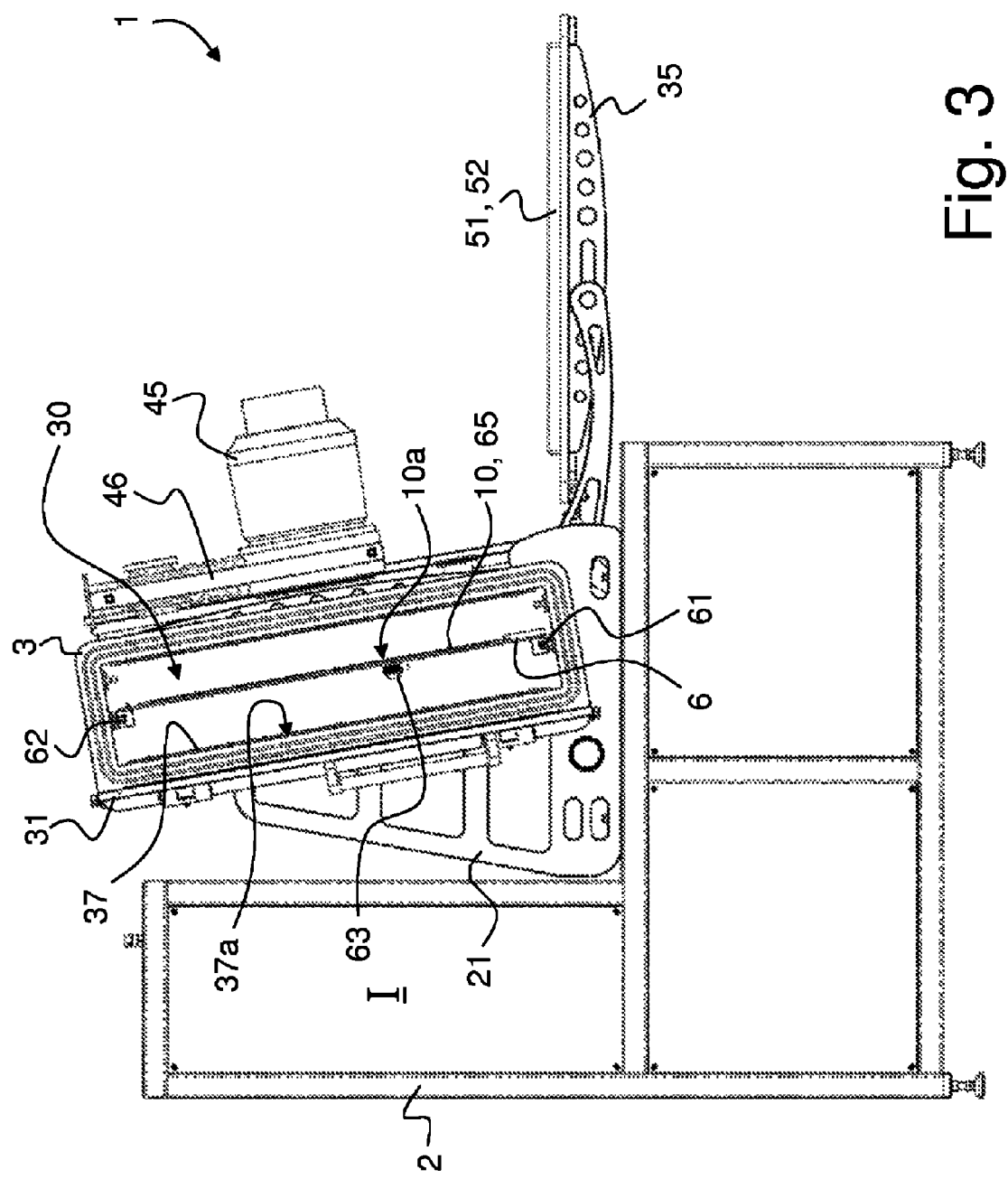
FIG. 3 is a side view of the intaglio printing plate coating apparatus of FIG. 1.
Figure 4:
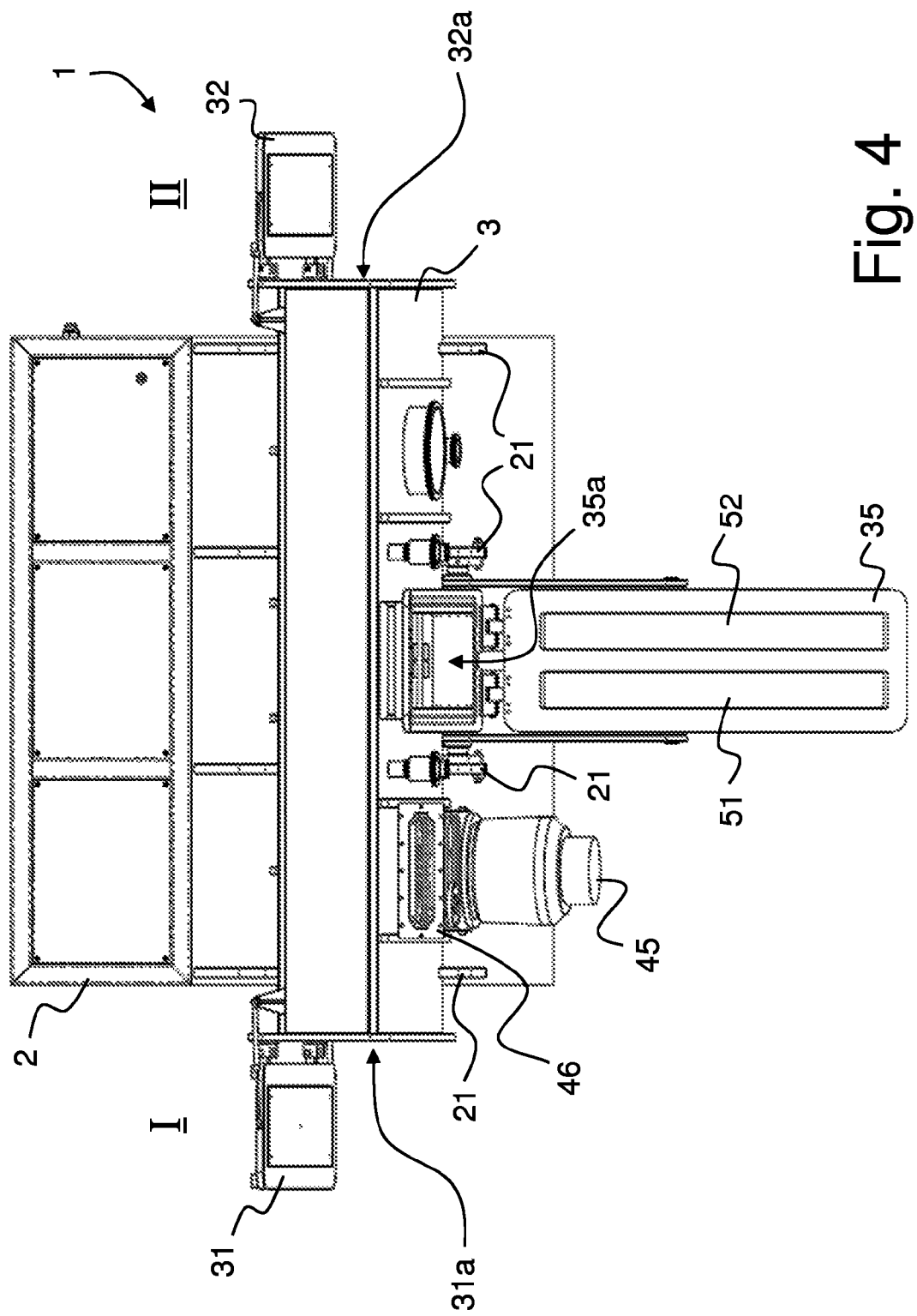
FIG. 4 is a top view of the intaglio printing plate coating apparatus of FIG. 1.

In the context of the present invention, reference will be made to a physical vapour deposition (PVD) technique known as "sputter deposition". Sputter deposition (or "sputtering") is a PVD method of depositing coating materials by sputtering, that is by ejecting atoms of coating material from a sputtering target comprising a solid source of coating material onto the desired substrate to be coated. Ejection (or sputtering) of the atoms from the sputtering target is typically performed by atom or ion bombardment of the sputtering target under vacuum, using an inert gas (such as argon) which is ionized in the vicinity of the sputtering target to produce ions (in particular argon ions Ar+) that are projected at high energy against the sputtering target, thereby causing ejection by sputtering of atoms of the coating material that are then projected ballistically onto the substrate to be coated. The high energy ions are typically generated by a plasma which is contained in the vicinity of the sputtering target by a suitable magnetic field. A reactive gas (such as nitrogen) can further be fed into the vacuum chamber during the sputtering process to create compounds onto the surface of the substrate being coated by combination of the sputtered atoms with the reactive gas FIG. 1 is a perspective view of an intaglio printing plate coating apparatus according to a preferred embodiment of the invention, which coating apparatus is generally designated by reference numeral 1. FIGS. 2 to 4 are respectively a front view, a side view, and a top view of the intaglio printing plate coating apparatus 1 of FIG. 1. FIGS. 5 to 8 are further illustrative views and schematic diagrams of the intaglio printing plate coating apparatus 1.

The intaglio printing plate coating apparatus 1 essentially comprises a chassis 2 supporting a vacuum chamber 3, which vacuum chamber 3 is supported in a substantially vertical manner by means of four vertical supporting members 21. More precisely, the vacuum chamber 3 exhibits an inner space 30 (see also FIGS. 3, 5, 6, and 7A-C) which is adapted to receive one intaglio printing plate 10 to be coated, the vacuum chamber 3 being arranged such that the intaglio printing plate 10 to be coated sits substantially vertically in the inner space 30 of the vacuum chamber 3 with its engraved surface, designated by reference numeral 10a, facing a frontal part of the apparatus 1 where at least one coating material target of a physical vapour deposition (PVD) system 5 are located, when in an operating position (see e.g. FIGS. 5 and 6). In this example, two such coating material targets designated by reference numerals 51 and 52 are provided. The PVD system 5 is intended to perform deposition under vacuum of a wear-resistant coating material onto the engraved surface 10a of the intaglio printing plate 10, each coating material target 51, 52 comprising a source of a desired wear-resistant coating material to be deposited, such as pure chromium or titanium (or the like coating materials suitable for PVD deposition).

Figure 5:
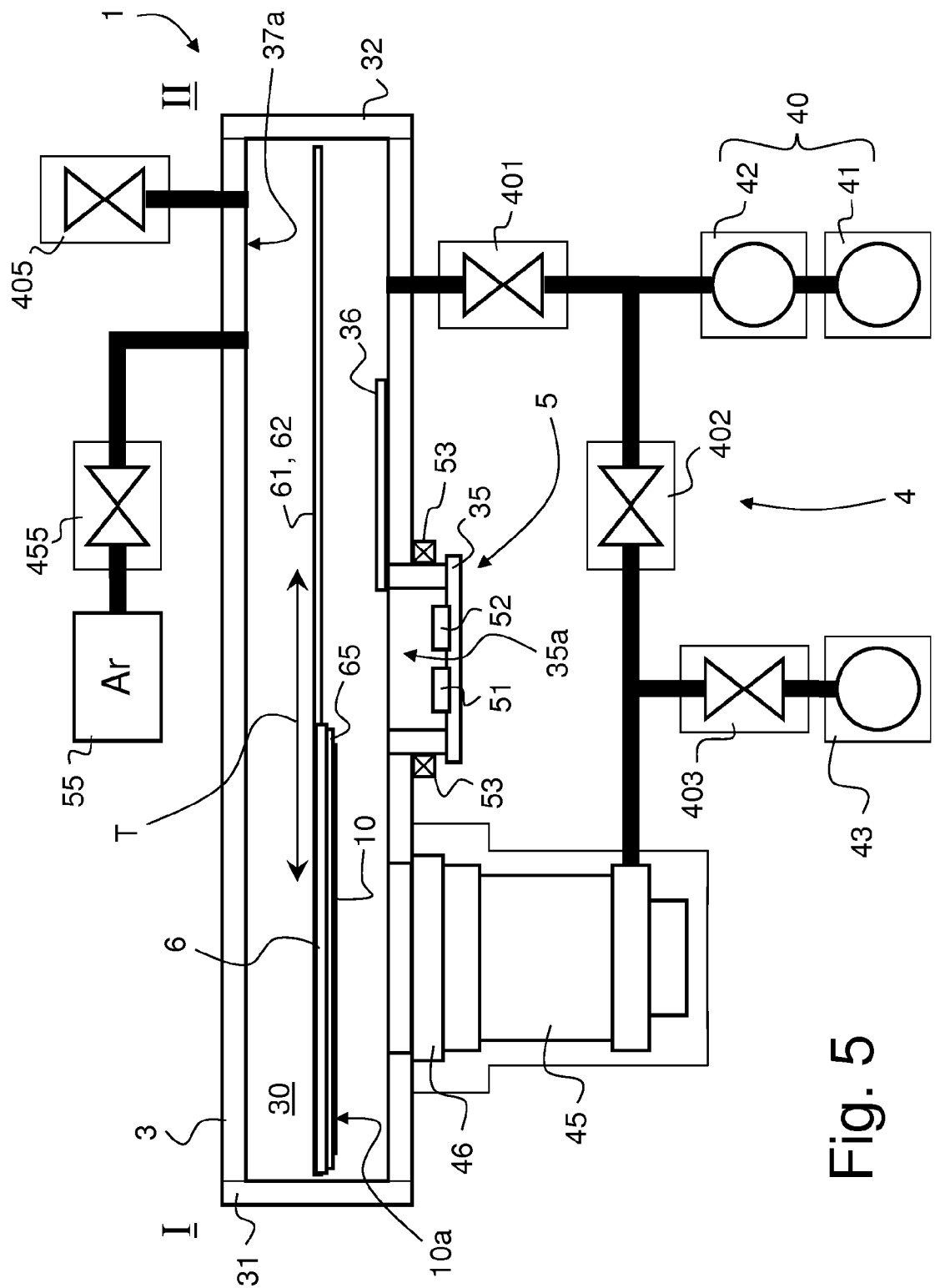
FIG. 5 is a diagram of the intaglio printing plate coating apparatus of FIG. 1 schematically showing further functional components of the apparatus.

According to this preferred embodiment, the PVD system 5 is a sputtering system comprising at least one sputtering target in the form of a magnetron acting as the coating material target (two such magnetrons acting as targets 51, 52 are provided in this case), a sputtering gas supply for supplying a sputtering gas (such as argon) to the inner space 30 of the vacuum chamber 3 (such sputtering gas supply is schematically illustrated in FIG. 5 as component 55), and an ionization system for causing sputtering of the wear-resistant coating material of targets 51, 52 and deposition of the sputtered wear-resistant coating material onto the engraved surface 10a of the intaglio printing plate 10. In this example, the coating material targets 51, 52 form a cathode of the sputtering system 5 as is typical in the art.

In this preferred example, the vacuum chamber 3 comprises a frontal opening 35a communicating with the inner space 30 of the vacuum chamber 3 and accommodating a retractable seal panel 35 onto which the coating material targets 51, 52 of the PVD system 5 are located. This retractable seal panel 35 can be moved between a retracted position during maintenance operations (as shown in FIGS. 1 to 4 and 8), thereby providing access to the inner space 30 of the vacuum chamber 3 through the frontal opening 35a, and a working position (as shown in FIGS. 5 to 7A-C) where the frontal opening 35a is closed in a seal manner by the retractable seal panel 35, thereby bringing the coating material targets 51, 52 to an operating position within the frontal opening 35a.

As shown in the Figures, the retractable seal panel 35 is advantageously pivoted at one end (namely a lower end) onto the vacuum chamber 3. As further shown in FIGS. 1 to 4, the retractable panel preferably lies, in the retracted position, substantially horizontally with a surface of the coating material targets 51, 52 being oriented upwards, which facilitates maintenance operations, such as replacement of any one of the coating material targets 51, 52 by a new target. Actuation of the retractable seal panel 35 from the working position to the retracted position, and vice versa, can be performed by means of a suitable actuating mechanism, such as a motor-driven actuating mechanism.

A movable carrier 6 is further provided and located within the inner space 30 of the vacuum chamber 3, which movable carrier 6 is adapted to support and cyclically move the intaglio printing plate 10 in front of and past the coating material targets 51, 52. In the present instance, the vacuum chamber 3 and movable carrier 6 are arranged so that the intaglio printing plate 10 to be coated is inclined rearwards (see FIG. 3), the angle of inclination between the engraved surface 10a of the intaglio printing plate 10 and a vertical plane preferably not exceeding 20 degrees.

In the illustrated embodiment, as schematically shown in FIGS. 5 and 6) the movable carrier 6 is adapted to translate the intaglio printing plate 10 back and forth within the inner space 30 of the vacuum chamber 3 and along a translation path T in front of and past the coating material targets 51, 52. The vacuum chamber 3 is accordingly configured to exhibit an elongated shape with first and second extremities, indicated generally by references I and II, at both ends of the translation path T of the movable carrier 6.

In addition, the movable carrier 6 is advantageously adapted to receive an intaglio printing plate support 65 (see FIGS. 2, 3, 5, 6) onto which the intaglio printing plate 10 is mounted, the support 65 being removable from the movable carrier 6 together with the intaglio printing plate 10. The carrier 6 itself is guided along the translation path T by way of lower and upper guiding rails 61, 62 (see FIG. 3) which are secured to lower and upper inner walls of the vacuum chamber 3. Actuation of the movable carrier 6 along the translation path T is performed by an adequate actuating mechanism, such as a motor driving a gear (not shown) that meshes and interacts with a rack 63 (visible in FIG. 3) located on a rear side of the movable carrier 6.

As further shown in FIGS. 1 to 3, removable protective panels 37 are provided on at least a rear inner wall 37a of the vacuum chamber 3 behind the movable carrier 6. These removable protective panels 37 are designed to facilitate cleaning operations and removal of residues of the coating process.

Figure 8:
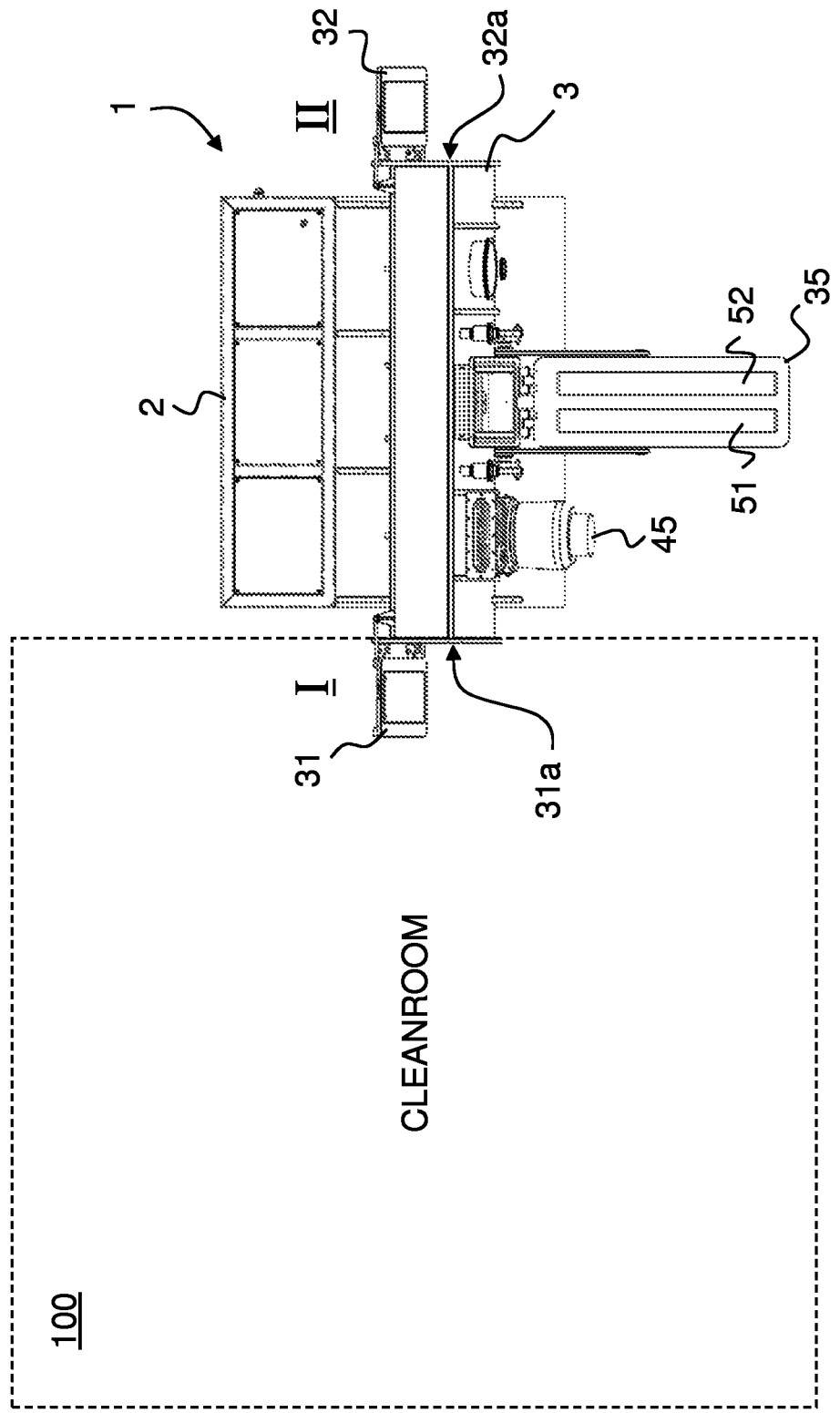
FIG. 8 schematically illustrates the intaglio printing plate coating apparatus coupled at one extremity to a cleanroom where intaglio printing plates to be coated are prepared before the coating operation and where coated intaglio printing plate are handled after the coating operation.

A first seal door 31 is provided as the first extremity I of the vacuum chamber 3, which first seal door 31 provides an access, as designated by reference numeral 31a, to the inner space 30 of the vacuum chamber 3 to allow loading of an intaglio printing plate 10 to be coated or unloading of a coated intaglio printing plate 10. As schematically illustrated by FIG. 8, the first extremity I of the vacuum chamber 3 is preferably coupled to a cleanroom 100 from which loading or unloading of intaglio printing plates 10 to or from the vacuum chamber 3 is performed. This allows for a proper handling, in a controlled environment, of the intaglio printing plates 10 before and after the coating operation, while avoiding the necessity of the entire coating apparatus 1 being located in the cleanroom 100, an operator within the cleanroom 100 being provided with access to the coating apparatus 1 via the first seal door 31 and access 31 a to the inner space 30 of the vacuum chamber 3.

A second seal door 32 can further be provided at the second extremity II of the vacuum chamber 3, which second seal door 32 provides a further access, as designated by reference numeral 32a, to the inner space 30 of the vacuum chamber for maintenance purposes.

During a coating operation, the inner space 30 of the vacuum chamber 3 is closed in a sealed manner, the retractable seal panel 35 and seal doors 31, 32 being closed and secured to the main frame of the vacuum chamber 3. A suitable vacuum system 4 is coupled to the vacuum chamber 3 in order to create vacuum in the inner space 30 of the vacuum chamber. Some components of the vacuum system 4 are visible in FIGS. 1 to 4, including a so-called turbomolecular vacuum pump 45 (as supplied for instance by company Oerlikon Leybold Vacuum GmbH—www.oerlikon-.com/leyboldvaccum) and an associated control gate valve 46 (as supplied for instance by company VAT Vakuumventile AG—www.vatvalve.com) which are mounted directly on a front side of the vacuum chamber 3.

FIG. 5 is a schematic illustration showing a diagram of the vacuum system 4 used in the context of the preferred embodiment of the invention. Such vacuum system 4 comprises a main vacuum pump system 40 comprising a first vacuum pump 41 and a second vacuum pump 42 connected in series (such as so-called roots pumps as supplied by company Oerlikon Leybold Vacuum GmbH—www.oerlikon.com/leyboldvaccum). As shown in FIG. 5, the main vacuum pump system 40 is operatively coupled to the inner space 30 of the vacuum chamber 3 via a conduit comprising a first valve 401. The main vacuum pump system 40 is further coupled to the inner space 30 of the vacuum chamber 3 via the turbomolecular pump 45 and a conduit comprising a further valve 402. An auxiliary pump 43 is also provided, which auxiliary pump 43 is coupled to the turbomolecular pump 45 via conduit comprising a third valve 403. A discharge valve 405 is also provided, which discharge valve 405 is released at the end of the coating process to allow the pressure in the inner space 30 of the vacuum chamber 3 to return to atmospheric pressure. As further illustrated in FIG. 5, the sputtering gas supply 55 is coupled to the inner space 30 of the vacuum chamber 3 via a conduit comprising a valve 455 to allow injection of the required sputtering gas (such as argon). It shall be understood that more than one sputtering gas supply could be provided, as well as further supplies of e.g. a reactive gas (such as nitrogen), if necessary.

Figure 7A:
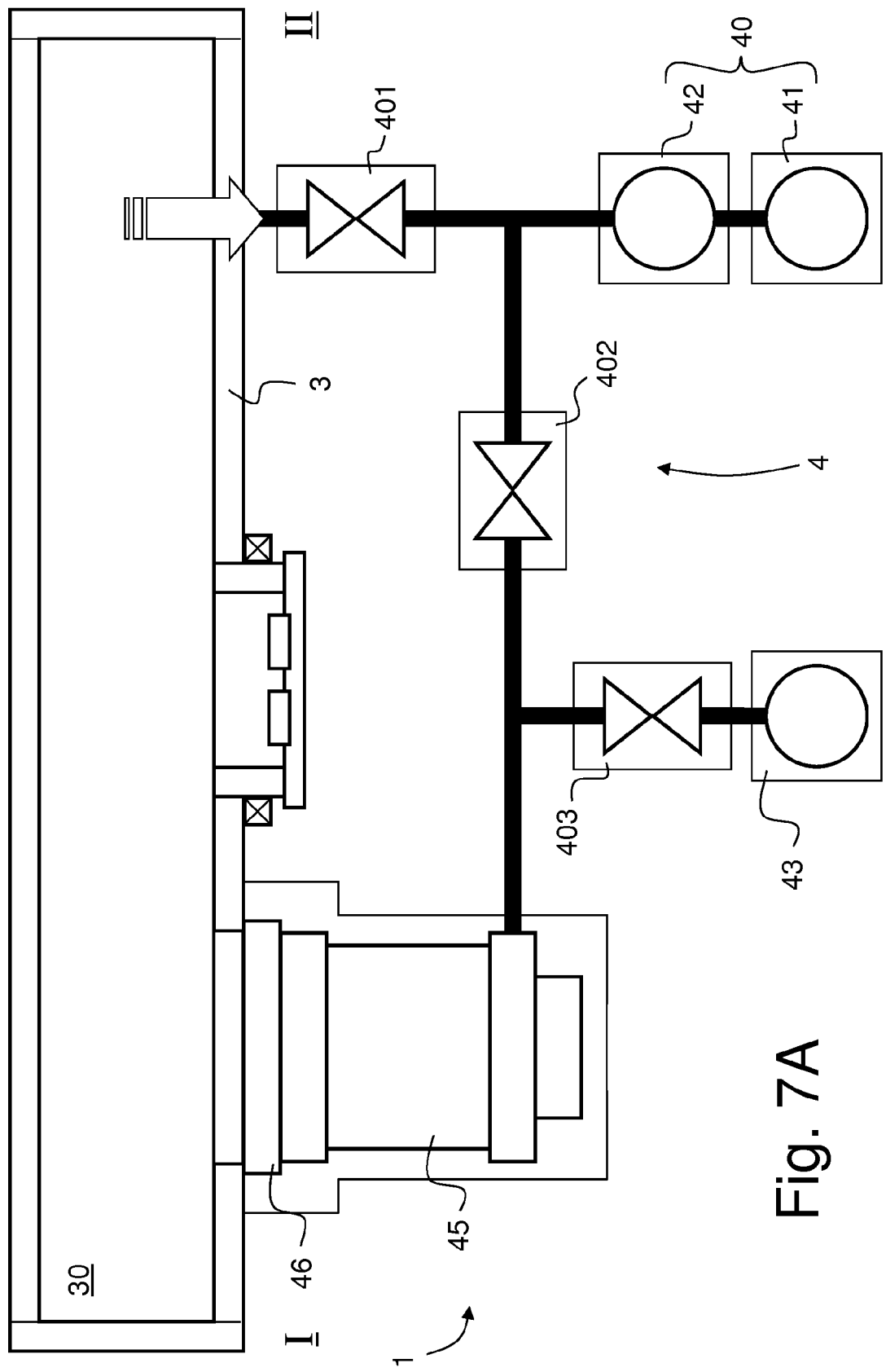
FIGS. 7A to 7C are schematic illustrative views showing a possible operation of a vacuum system coupled to the vacuum chamber by means of which vacuum is created in the inner space of the vacuum chamber.
Figure 7B:
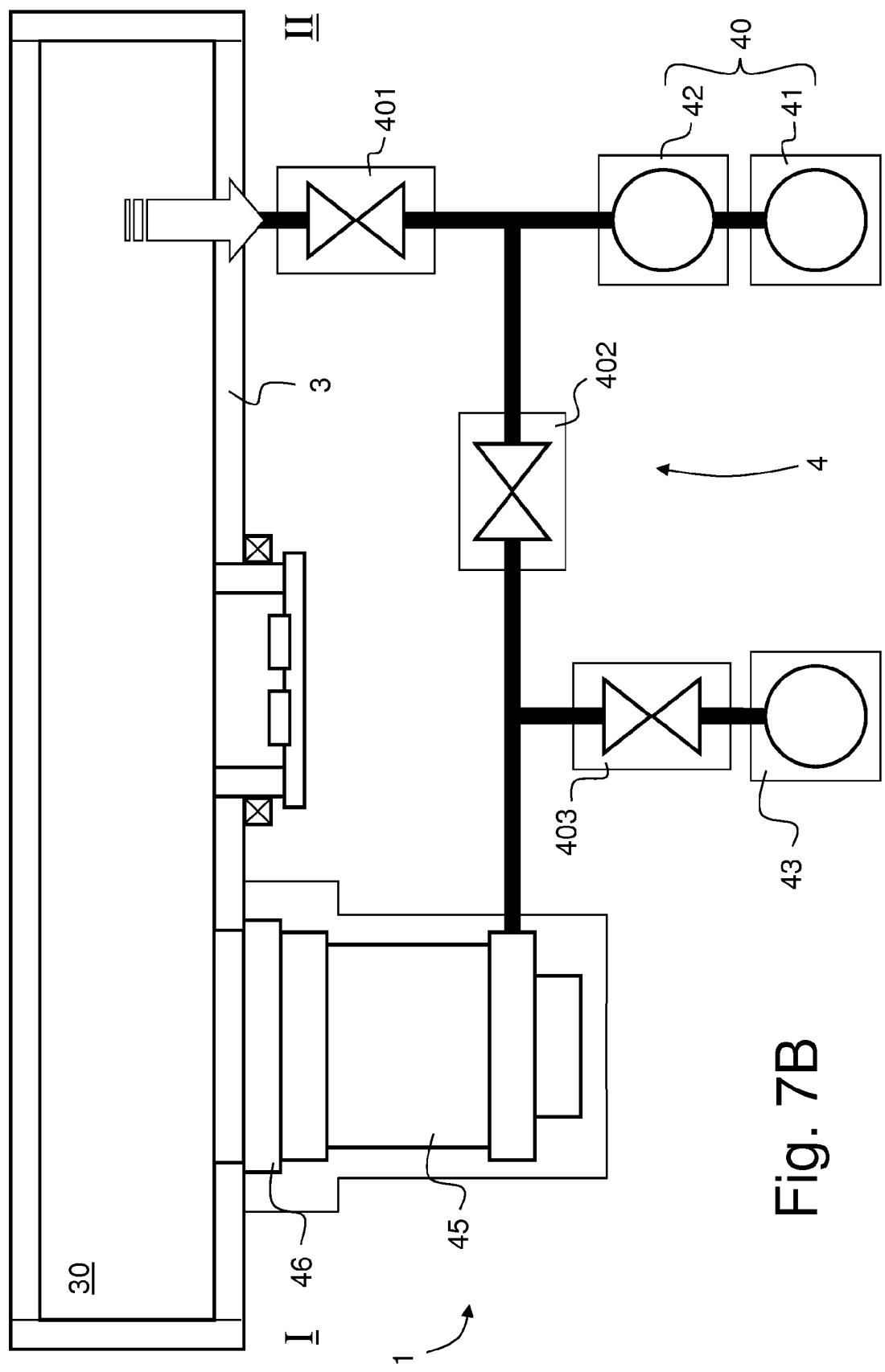
Figure 7C:
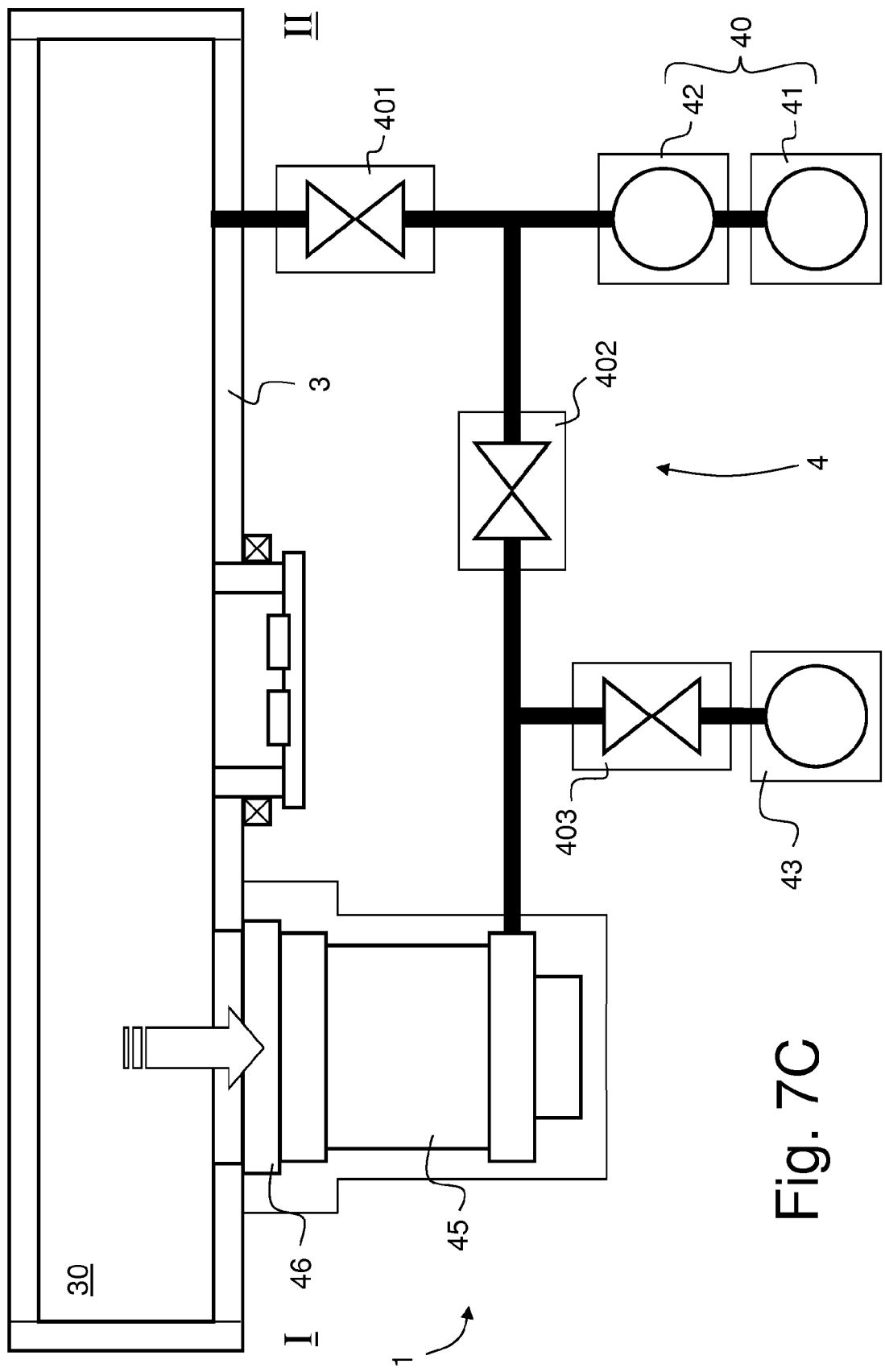

FIGS. 7A-C are schematic views illustrating a possible operation of the vacuum system 4 whereby vacuum is created in the inner space 30 of the vacuum chamber 3. As shown in FIG. 7A, in an initial stage, air is pumped from the inner space 30 of the vacuum chamber 3 via the conduit comprising the valve 401 by means of the first vacuum pump 41 of the main vacuum pump system 40 (the second vacuum pump 42 being inactive in this initial stage). The turbomolecular pump 45 (which is operative) is not coupled to the inner space 30 of the vacuum chamber 3 in the initial stage and is also uncoupled from the main vacuum pump system 40 (valve 402 being closed). The auxiliary pump 43 (and associated valve 403) is however active in order to maintain a low pressure in the conduit downstream of the turbomolecular pump 45. In a second stage, as illustrated by FIG. 7B, the second vacuum pump 42 comes into play in order to pump a greater volume of air away from the inner space 30 of the vacuum chamber 3. When the pressure inside the inner space 30 of the vacuum chamber 3 reaches a defined level where the turbomolecular pump 45 can be exploited, valves 401 and 403 are successively closed, while valve 402 is opened. At the same time, the control gate valve 46 is opened in order to couple the turbomolecular pump 45 to the inner space 30 of the vacuum chamber 3, thereby allowing air to be pumped through the turbomolecular pump 45 and main vacuum pump system 40. The control gate valve 46 can be operated in a so-called "throttling" mode to allow for suitable control and adjustment of the vacuum level inside the vacuum chamber 3.

Once an adequate vacuum level is created in the inner space 30 of the vacuum chamber 3, the PVD coating operation can start using the above-described sputtering system. During the coating operation, the sputtering gas (e.g. argon) is injected in the vacuum chamber 3, which sputtering gas is ionized to produce high-energy ions (such as argon ions Ar+) which are projected onto the coating material targets 51, 52 to cause sputtering of the coating material and re-deposition of the sputtered coating material onto the engraved surface 10a of the intaglio printing plate 10. During this process, the movable carrier 6 is operated so as to cyclically move the intaglio printing plate 10 in front of and past the targets 51, 52 as depicted in FIGS. 5 and 6. This process can take several minutes up to a couple of hours, depending on the desired thickness of coating material that one wishes to deposit onto the engraved surface 10a of the intaglio printing plate 10, which thickness is typically of the order of a few microns.

A refinement of the above-described preferred embodiment may consist in further providing means for shaping a magnetic field of the magnetron(s) used as the coating material target(s) 51, 52. Indeed, tests have demonstrated that shaping of the magnetic field produced by the magnetrons can have a positive impact on the deposition process and/or the usage of the coating material targets. Such means for shaping the magnetic field of the magnetron(s) may for instance include an electrical winding 53 surrounding the frontal opening 35a (see FIGS. 5 and 6) and being placed in the vicinity of the coating material target(s) 51, 52, when brought to the operating position, which electrical winding 53 is energized during a sputtering operation. The resulting electromagnetic field produced by the electrical winding 53 has the effect of shaping the magnetic field produced by the magnetron(s) 51, 52 and can be adjusted, if required.

A further refinement of the above-described preferred embodiment may consist in providing a shutter mechanism 36 (see FIGS. 5 and 6) for selectively creating a separation between the inner space 30 of the vacuum chamber 3 and the coating material targets 51, 52 located on the retractable seal panel 35. This shutter mechanism 36 is advantageous in that it allows to carry out separate cleaning of the surface of the intaglio printing plate 10 and of the surface of the coating material targets 51, 52 without this impacting on the quality of the coating operation. More precisely, by closing the shutter mechanism 36, the sputtering system 5 can be operated to cause ablation of small layer of coating material from the surface of the coating material targets 51, 52, which surface may have been oxidized as a result of exposure of targets 51, 52 to ambient air, without this leading to any deposition onto the surface 10a of the intaglio printing plate 10. Similarly, the carrier 6 and intaglio printing plate 10 can be briefly put to a potential to act as cathode and sputtering gas injected in the inner space 30 of the vacuum chamber 3 to cause interaction with the surface 10a of the printing plate 10 and removal of any undesired residues or impurities that may remain on the surface 10a of the intaglio printing plate 10, without this having a negative impact of the coating material targets 51, 52.

Various modifications and/or improvements may be made to the above-described embodiments without departing from the scope of the invention as defined by the annexed claims. For instance, while sputter deposition was described in the context of the preferred embodiment discussed above, other PVD coating methods could potentially be applied, including electron beam evaporation. Sputtering however remains a preferred and particularly advantageous PVD coating method within the context of the present invention.

In addition, the vacuum chamber could be configured to accommodate more than one intaglio printing plate at a time.

LIST OF REFERENCE NUMERALS USED THEREIN 1 intaglio printing plate coating apparatus
2 chassis supporting vacuum chamber 3
3 vacuum chamber with inner space adapted to receive (at least) one intaglio printing plate to be coated
4 vacuum system coupled to vacuum chamber 3 for creating vacuum in the inner space 30 of the vacuum chamber 3
5 sputtering system for the deposition by sputtering of wear-resistant coating material onto an engraved surface of the intaglio printing plate
6 movable carrier supporting intaglio printing plate 10 to be coated
10 intaglio printing plate
10a engraved surface of intaglio printing plate (surface to be coated)
21 vertical supporting members of chassis 2 supporting the vacuum chamber 3
30 inner space of vacuum chamber 3
31 seal door on side I (loading/unloading of intaglio printing plate)
31a access to inner space 30 of vacuum chamber 3 for the loading/unloading of an intaglio printing plate
32 seal door (side II)
32a access to inner space 30 of vacuum chamber 3 (e.g. for maintenance operations)
35 retractable seal panel carrying sputtering target(s) 51, 52
35a frontal opening communicating with inner space 30 of vacuum chamber 3 (closed when retractable seal panel 35 is in its working position, coupled to the vacuum chamber 3)
36 shutter mechanism
37 removable protective panels
37a rear inner wall of vacuum chamber 3
40 main vacuum pump system (e.g. roots pumps)
41 first vacuum pump
42 second vacuum pump
43 auxiliary pump
45 turbomolecular vacuum pump
46 control gate valve
51 (first) sputtering target comprising a source of the wear-resistant coating material to be sputtered (such as a chromium magnetron)
52 (second) sputtering target comprising a source of the wear-resistant coating material to be sputtered (such as a chromium magnetron)

53 electrical winding surrounding frontal opening 35*a*
55 sputtering gas supply for the supply of a sputtering gas (such as argon) to the inner space of the vacuum chamber 3
61 lower guiding rail of movable carrier 6
62 upper guiding rail of movable carrier 6
63 rack for translation of movable carrier 6
65 intaglio printing plate support
100 cleanroom
401 valve between main vacuum pump system 40 and inner space 30 of vacuum chamber 3
402 valve between main vacuum pump system 40 and turbomolecular vacuum pump 45
403 valve between auxiliary pump 43 and turbomolecular vacuum pump 45
405 discharge valve
455 valve between sputtering gas supply 55 and inner space 30 of vacuum chamber 3
I first extremity of vacuum chamber 3 (loading/unloading side of intaglio printing plate coating apparatus 1)
II second extremity of vacuum chamber 3 (opposite to side I)
T translation path of carrier 6

The invention claimed is:

1. An intaglio printing plate coating apparatus comprising:
   a vacuum chamber having an inner space adapted to receive at least one intaglio printing plate to be coated;
   a vacuum system coupled to the vacuum chamber and adapted to create vacuum in the inner space of the vacuum chamber; and
   a physical vapour deposition (PVD) system adapted to perform deposition of wear-resistant coating material under vacuum onto an engraved surface of the intaglio printing plate, which physical vapour deposition system includes at least one coating material target comprising a source of the wear-resistant coating material to be deposited onto the engraved surface of the intaglio printing plate,
   wherein the vacuum chamber is arranged so that the intaglio printing plate to be coated sits substantially vertically in the inner space of the vacuum chamber with its engraved surface facing the at least one coating material target,
   and wherein the intaglio printing plate coating apparatus further comprises a movable carrier located within the inner space of the vacuum chamber and adapted to support and cyclically move the intaglio printing plate in front of and past the at least one coating material target.

2. The intaglio printing plate coating apparatus as defined in claim 1, wherein the physical vapour deposition system is a sputtering system comprising:
   at least one sputtering target in the form of a magnetron acting as the coating material target;
   a sputtering gas supply adapted to supply a sputtering gas to the inner space of the vacuum chamber; and
   an ionization system adapted to cause sputtering of the wear-resistant coating material of the at least one sputtering target and deposition of the sputtered wear-resistant coating material onto the engraved surface of the intaglio printing plate.

3. The intaglio printing plate coating apparatus as defined in claim 2, wherein the sputtering system comprises at least two sputtering targets each comprising a source of a wear-resistant coating material to be sputtered.

4. The intaglio printing plate coating apparatus as defined in claim 3, wherein the source of wear-resistant coating material to be sputtered is pure chromium.

5. The intaglio printing plate coating apparatus as defined in claim 1, wherein the vacuum chamber and movable carrier are arranged so that the intaglio printing plate to be coated is inclined rearwards.

6. The intaglio printing plate coating apparatus as defined in claim 5, wherein an angle of inclination between the engraved surface of the intaglio printing plate and a vertical plane does not exceed 20 degrees.

7. The intaglio printing plate coating apparatus as defined in claim 1, wherein the movable carrier is adapted to translate the intaglio printing plate back and forth within the inner space of the vacuum chamber and along a translation path in front of and past the at least one coating material target.

8. The intaglio printing plate coating apparatus as defined in claim 7, wherein the vacuum chamber exhibits an elongated shape with first and second extremities at both ends of the translation path of the movable carrier and wherein a first seal door is provided at the first extremity of the vacuum chamber, which first seal door provides an access to the inner space of the vacuum chamber to allow loading of an intaglio printing plate to be coated or unloading of a coated intaglio printing plate.

9. The intaglio printing plate coating apparatus as defined in claim 8, wherein the first extremity of the vacuum chamber is coupled to a cleanroom from which loading or unloading of intaglio printing plates to or from the vacuum chamber is performed.

10. The intaglio printing plate coating apparatus as defined in claim 8, wherein a second seal door is provided at the second extremity of the vacuum chamber, which second seal door provides a further access to the inner space of the vacuum chamber for maintenance purposes.

11. The intaglio printing plate coating apparatus as defined in claim 1, wherein removable protective panels are provided on at least a rear inner wall of the vacuum chamber behind the movable carrier.

12. The intaglio printing plate coating apparatus as defined in claim 1, wherein the movable carrier is adapted to receive an intaglio printing plate support onto which the intaglio printing plate is mounted, which intaglio printing plate support is removable from the movable carrier together with the intaglio printing plate.

13. The intaglio printing plate coating apparatus as defined in claim 1, wherein the vacuum chamber comprises a frontal opening communicating with the inner space of the vacuum chamber and accommodating a retractable seal panel onto which the at least one coating material target is located, which retractable seal panel can be moved between a retracted position during maintenance operations, thereby providing access to the inner space of the vacuum chamber through the frontal opening, and a working position where the frontal opening is closed in a sealed manner by the retractable seal panel, thereby bringing the at least one coating material target to an operating position within the frontal opening.

14. The intaglio printing plate coating apparatus as defined in claim 13, wherein the retractable seal panel is pivoted at one end onto the vacuum chamber.

15. The intaglio printing plate coating apparatus as defined in claim 14, wherein, in the retracted position, the retractable seal panel lies substantially horizontally with a surface of the at least one coating material target being oriented upwards.

16. The intaglio printing plate coating apparatus as defined in claim 13, further comprising a shutter mechanism adapted to selectively create a separation between the inner space of the vacuum chamber and the at least one coating material target located on the retractable seal panel.

17. The intaglio printing plate coating apparatus as defined in claim 13, wherein the physical vapour deposition system is a sputtering system comprising at least one sputtering target in the form of a magnetron acting as the coating material target and wherein the intaglio printing plate coating apparatus further comprises means adapted to shape a magnetic field of the magnetron.

18. The intaglio printing plate coating apparatus as defined in claim 17, wherein the means adapted to shape the magnetic field of the magnetron include an electrical winding surrounding the frontal opening and being placed in the vicinity of the at least one coating material target, when brought to the operating position, which electrical winding is energized during a sputtering operation.

19. The intaglio printing plate coating apparatus as defined in claim 1, wherein the vacuum system comprises a main pump system and at least one turbomolecular vacuum pump.

20. The intaglio printing plate coating apparatus as defined in claim 19, wherein the turbomolecular vacuum pump is coupled to the inner space of the vacuum chamber via a control gate valve.

* * * * *